US009536985B2

(12) United States Patent
Chudzik et al.

(10) Patent No.: US 9,536,985 B2
(45) Date of Patent: Jan. 3, 2017

(54) EPITAXIAL GROWTH OF MATERIAL ON SOURCE/DRAIN REGIONS OF FINFET STRUCTURE

(71) Applicant: GLOBALFOUNDRIES INC., Grand Cayman (KY)

(72) Inventors: Michael P. Chudzik, Sunnyvale, CA (US); Brian J. Greene, Fishkill, NY (US); Eric C. T. Harley, Bel Air, MD (US); Judson R. Holt, Wappingers Falls, NY (US); Yue Ke, Fishkill, NY (US); Rishikesh Krishnan, Painted Post, NY (US); Renee T. Mo, Yorktown Heights, NY (US); Yinxiao Yang, Beacon, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/499,356

(22) Filed: Sep. 29, 2014

(65) Prior Publication Data

US 2016/0093720 A1  Mar. 31, 2016

(51) Int. Cl.
*H01L 29/66* (2006.01)

(52) U.S. Cl.
CPC ................ *H01L 29/66795* (2013.01)

(58) Field of Classification Search
CPC ............. H01L 29/785; H01L 29/66795; H01L 29/66545; H01L 27/0886; H01L 29/7848; H01L 29/165
See application file for complete search history.

(56) References Cited

U.S. PATENT DOCUMENTS

| 8,264,034 | B2 | 9/2012 | Kim et al. |
| 8,415,224 | B2 | 4/2013 | Hyun et al. |
| 8,426,923 | B2 | 4/2013 | Lee et al. |
| 8,614,127 | B1 | 12/2013 | Yang et al. |
| 2011/0147828 | A1* | 6/2011 | Murthy ............ H01L 21/02057 257/327 |
| 2012/0193713 | A1 | 8/2012 | Kulkarni et al. |
| 2013/0154005 | A1 | 6/2013 | Basker et al. |
| 2013/0228865 | A1 | 9/2013 | Lin et al. |
| 2013/0277759 | A1 | 10/2013 | Chen et al. |
| 2013/0320399 | A1 | 12/2013 | Chang et al. |
| 2015/0372140 | A1* | 12/2015 | Liu ................... H01L 29/7848 257/190 |

* cited by examiner

*Primary Examiner* — Tony Tran
(74) *Attorney, Agent, or Firm* — Yuanmin Cai, Esq.

(57) ABSTRACT

A method for producing a semiconductor structure, as well as a semiconductor structure, that uses a partial removal of an insulating layer around a semiconductor fin, and subsequently epitaxially growing an additional semiconductor material in the exposed regions, while maintaining the shape of the fin with the insulating layer.

11 Claims, 12 Drawing Sheets

EPITAXIAL GROWTH OF MATERIAL ON SOURCE/DRAIN REGIONS OF FINFET STRUCTURE

BACKGROUND

The present invention relates to semiconductor devices, and particularly to forming source/drain regions and connections on fin field effect transistors.

Field effect transistors (FETs) are commonly employed in electronic circuit applications. FETs may include a source region and a drain region spaced apart by a semiconductor channel region. A gate, potentially including a gate dielectric layer, a work function metal layer, and a metal electrode, may be formed above the channel region. By applying voltage to the gate, the conductivity of the channel region may increase and allow current to flow from the source region to the drain region.

Fin field effect transistors (FinFETs) are an emerging technology which may provide solutions to field effect transistor (FET) scaling problems at, and below, the 22 nm node. FinFET structures may include at least a narrow semiconductor fin gated on at least two sides of each of the semiconductor fin, as well as a source region and a drain region adjacent to the fin on opposite sides of the gate. FinFET structures having n-type source and drain regions may be referred to as nFinFETs, and FinFET structures having p-type source and drain regions may be referred to as pFinFETs.

In some FinFET structures, different materials may be used for the fins of pFinFETs and nFinFETs in order to improve device performance. However, a material that may improve pFinFET performance may reduce nFET performance, and vice versa. For example, while pFinFET performance may be improved by forming fins made of silicon-germanium, nFinFET performance may instead be improved by forming fins made of undoped or carbon-doped silicon and may be degraded by forming fins made of silicon-germanium. Further, pFinFETs and nFinFETs are often fabricated on the same substrate.

BRIEF SUMMARY

An embodiment of the invention may include a method of forming a semiconductor structure where a semiconductor fin is formed on a substrate, and the fin has a source/drain region and a gate region. A gate may be formed above the gate region of the semiconductor fin. An insulating layer is then deposited above the gate structure. A first etch may be performed where the insulating layer is removed above the top surface of the source/drain region of the semiconductor fin. A second etch may be performed to remove a portion of the semiconductor fin in the source/drain region, and a semiconductor material is grown in the source/drain region of the fin removed by the second etch.

Another embodiment of the invention may include a method of forming a semiconductor structure where a semiconductor fin is formed on a substrate, and the fin has a source/drain region and a gate region. A gate may be formed above the gate region of the semiconductor fin. An insulating layer may be deposited above the gate structure. A first etch may be performed where the insulating layer is removed above the top surface of the source/drain region of the semiconductor fin. A surface refresh may be performed, where the surface refresh creates additional sites for epitaxial nucleation, and epitaxial growth of a semiconductor material on the surface may be performed.

An additional embodiment of the invention may include a semiconductor structure that includes a portion of a fin etched from a semiconductor substrate, where the portion of the fin has a source/drain region and a gate region. A gate is located above, and perpendicular to, the gate region of the portion of the fin. A pair of fin spacers is located on the vertical sidewalls of the portion of the fin in the source/drain region. An epitaxial semiconductor material is between the vertical sidewalls.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

During the manufacture of Fin Field Effect Transistor (FinFET) structures, many deposition and removal techniques are performed to create the desired structure. In some instances, it may be beneficial to epitaxial grow an additional semiconductor material on the fin in order to create a better junction between the electrode and the source/drain region of the gate. Doing this may decrease the overall resistance of the gate, as well as reduce unwanted capacitance. After the formation of a gate above a fin, previous methods removed all of the unnecessary insulating material around the fins prior to epitaxial growth of the additional semiconductor material, which may have caused problems for nucleation of epitaxial growth sites, as well as integration challenges for protection of the gate structures due to the extensive insulator etching. The loss of nucleation sites for epitaxial growth may cause problems for dopant delivery, which may reduce production yield due to shorts between Source/Drain(S/D) regions of adjacent structures in embedded Dynamic Random Access Memory (EDRAM) and static RAM (SRAM) located on the semiconductor chip. Reducing dielectric etching to retain a portion of the insulating material on the sides of the fins may reduce impact on the device due to the isotropic nature of dopant diffusion. A subsequent recess or strip of the fin may be performed, which may encourage better nucleation sites for growth of the additional semiconductor material in the vertical direction, and may improve overall production yield of the device by only growing additional semiconductor material where it is necessary and eliminating lateral over growth of S/D material in other regions of the device. The recess of the fin, while retaining a portion of the insulating material on the fin sidewalls, may also allow for a replacement of some, or all, of the source/drain regions of the fin with a highly conductive semiconductor material. This may create a FinFET device with improved overall resistance. This may enable an embedded source drain region, similar to those of planar FETs, but with the dimensions and characteristics of Fin-FETs.

Figure 1A:
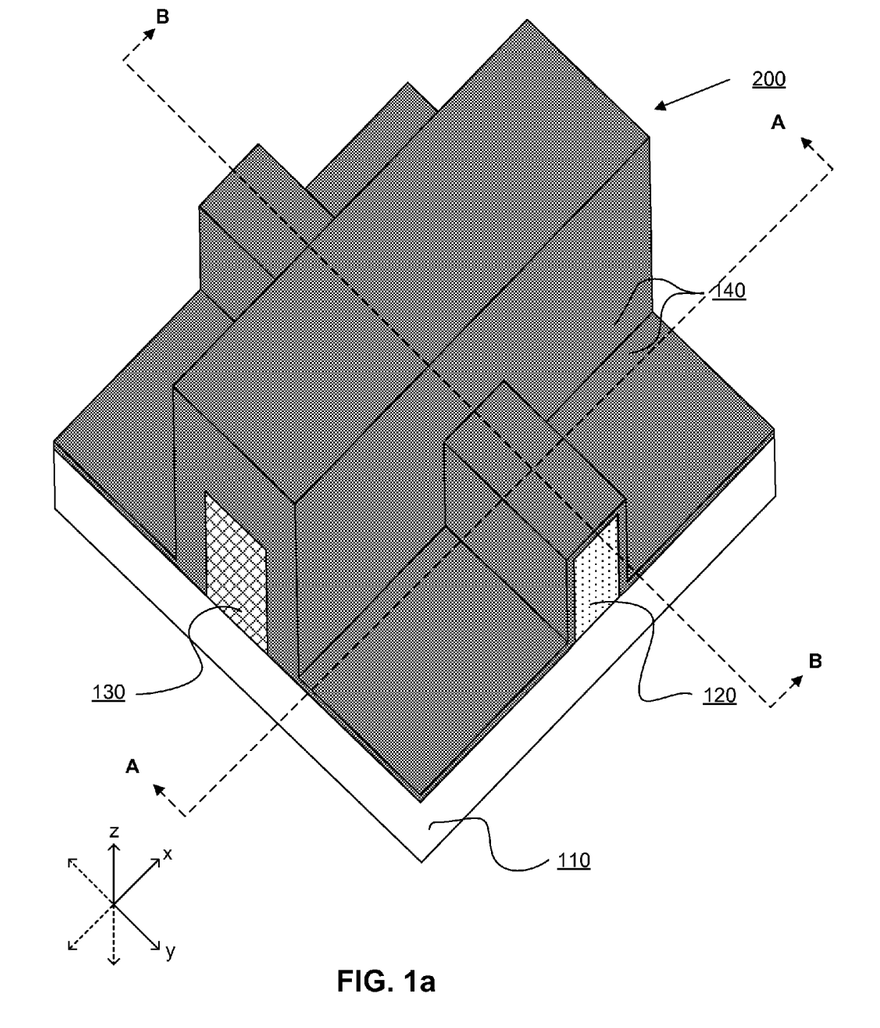
FIG. 1a is an isometric view depicting a FinFET structure, according to an exemplary embodiment.
Figure 1B:
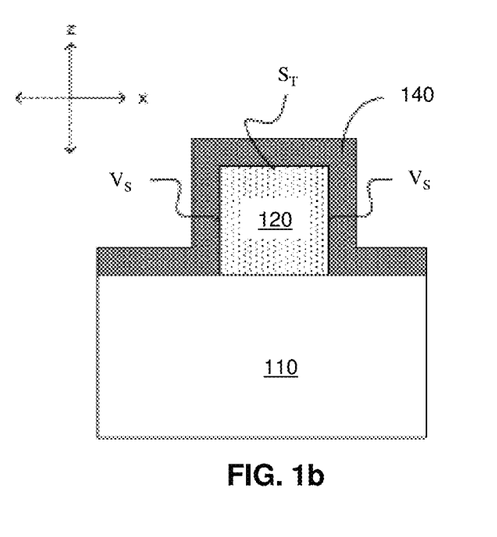
FIG. 1b is a cross-sectional view of FIG. 1a, taken along section line A-A.
Figure 1C:
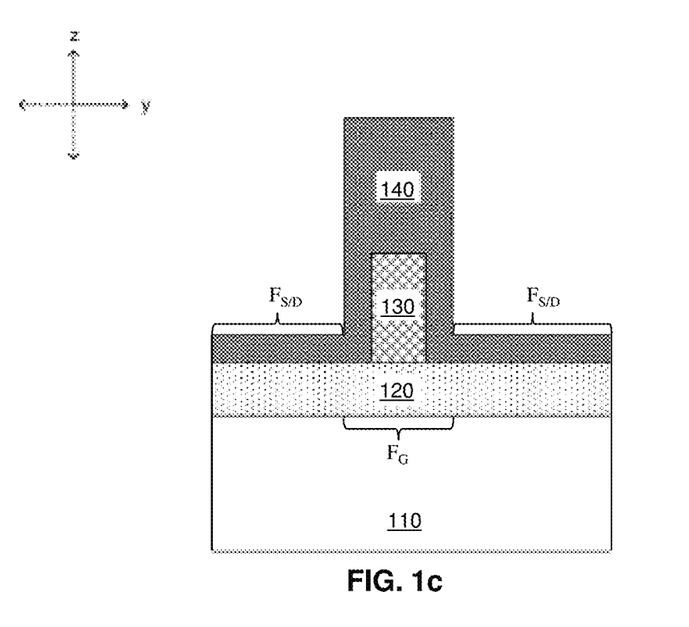
FIG. 1c is a cross-sectional view of FIG. 1a, taken along section line B-B.

Referring to FIGS. 1a-1c, a fin 120 may be located above a substrate 110. The fin 120 may have a width ranging from approximately 2 nm to approximately 40 nm, preferably approximately 4 nm to approximately 20 nm; a height ranging from approximately 5 nm to approximately 300 nm, preferably approximately 10 nm to approximately 80 nm. The fin 120 may be formed, for example by removing material from the substrate 110 using a photolithography process followed by an anisotropic etching process such as reactive ion etching (RIE) or plasma etching. Other methods of forming fins known in the art may also be utilized, such as sidewall image transfer (SIT).

In some embodiments, the substrate 110 may be either a bulk substrate or a semiconductor on insulator (SOI) substrate. In embodiments where the substrate 110 is a bulk substrate, the material of the fin 120 may be the same as the substrate 110 and there may be no identifiable boundary between the fin 120 and the substrate 110. The substrate 110 may be made of any semiconductor material typically known in the art, including, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. In embodiments where the substrate 110 is an SOI substrate, the fin 120 may be formed from a top semiconductor layer separated from a base semiconductor substrate by a buried insulator layer(not shown). In such embodiments, the top semiconductor layer and the base semiconductor substrate may be made of the same materials as the bulk substrate discussed above. The buried insulator layer may have a thickness ranging from approximately 100 to approximately 500 nm, preferably about 200 nm. In such embodiments, the fin 120 may rest on the buried insulator layer, separated from the base semiconductor substrate.

Still referring to FIGS. 1a-1c, a gate structure 200 may be located above the substrate 110, and cross over a portion of the fin 120. The gate structure 200 may be substantially perpendicular to the fin 120, having a gate region $F_G$ where the fin 120 passes through the gate structure 200, and a source/drain region $F_{S/D}$ of the fin 120 located on both sides of the gate region $F_G$. The gate structure 200 may contain a gate layer 130, a spacer, such as insulating layer 140 and a hard cap (not shown). The gate layer 130 may have a height of approximately 40 nm to approximately 200 nm, preferably approximately 50 nm to approximately 150 nm. The gate layer 130 may include a gate dielectric layer (not shown) on the fin 120 and a gate electrode on the gate dielectric layer (not shown) that may be formed via any known process in the art, including a gate-first process and a gate-last process. The gate layer 130 and the insulating layer 140 may directly contact the fin 120 on a vertical sidewalls $V_S$ and a top surface $S_T$ of the fin 120 in the gate region $F_G$ and source/drain region $F_{S/D}$, respectively.

In a gate-first process, the gate dielectric layer may include any suitable insulating material including, but not limited to: oxides, nitrides, oxynitrides or silicates including metal silicates and nitrided metal silicates. In one embodiment, the gate dielectric may include a high-k oxide such as, for example, silicon oxide (SixOy), hafnium oxide (HfxOy), zirconium oxide (ZrxOy), aluminum oxide (AlxOy), titanium oxide (TixOy), lanthanum oxide (LaxOy), strontium titanium oxide (SrxTiyOz), lanthanum aluminum oxide (LaxAlyOz), and mixtures thereof. The gate dielectric layer may be deposited over the fin 120 using any suitable deposition technique known the art, including, for example, atomic layer deposition (ALD), chemical vapor deposition (CVD), physical vapor deposition (PVD), molecular beam deposition (MBD), pulsed laser deposition (PLD), or liquid source misted chemical deposition (LSMCD). The gate electrode may be made of gate conductor materials including, but not limited to, zirconium, tungsten, tantalum, hafnium, titanium, aluminum, ruthenium, metal carbides, metal nitrides, transition metal aluminides, tantalum carbide, titanium carbide, tantalum magnesium carbide, or combinations thereof. The gate electrode may be formed using any suitable metal deposition technique, including, for example, CVD, PVD, and ALD, sputtering, and plating.

In a gate-last process, the gate layer 130 may include a sacrificial gate (not shown) that may be later removed and replaced by a gate dielectric layer and a gate electrode such as those of the gate-first process described above. In an exemplary embodiment, the sacrificial gate may be made of a polysilicon material with a sacrificial dielectric material (e.g., silicon oxide) formed using deposition techniques known in the art, including, for example, ALD, CVD, PVD, MBD, PLD, LSMCD, sputtering, and plating. Other suitable materials and methods of forming a sacrificial gate are known in the art.

Still referring to FIGS. 1a-1c, a insulating layer 140 may be formed on the exposed surfaces of the substrate 110, the gate layer 130 and the fin 120. For simplicity, FIG. 1a (as well as FIGS. 2a-6a) is an illustration of a single intersection of a fin and a gate structure, but may be part of a lager semiconductor device. The insulating layer 140 may be made of any suitable insulating material, such as silicon nitride, silicon oxide, silicon oxynitrides, or a combination thereof, and may have a thickness ranging from 2 nm to approximately 100 nm. In a preferred embodiment, the insulating layer 140 may be made of silicon nitride and have a thickness ranging from approximately 2 nm to approximately 25 nm. The insulating layer 140 may be formed by any method known in the art, including depositing a conformal silicon nitride layer over the gate layer 130. Further, in various embodiments, the insulating layer 140 may include one or more layers.

In some embodiments, the hard cap (not shown) may be located above the gate layer 130. The hard cap may be made of an insulating material, such as, for example, silicon nitride or silicon oxide, capable of protecting the gate layer 130 during subsequent processing steps. In embodiments where the substrate 110 is a bulk substrate, an insulating layer may be deposited around the base of the fin prior to forming the gate layer 130 to insulate the gate layer 130 from the substrate 110. Further, while only a single gate layer 130 is shown, some embodiments may include more than one gate above the fin 120.

Figure 2A:
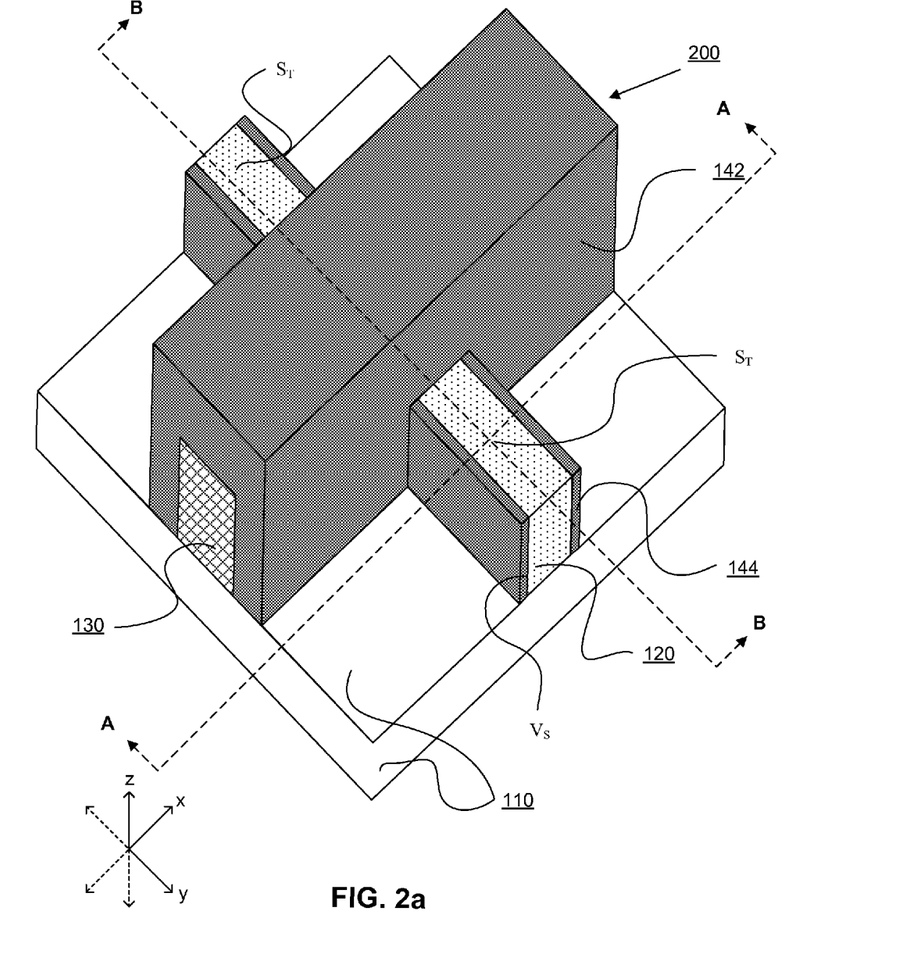
FIG. 2a is an isometric view depicting removing the insulating layer above the fins of a FinFET structure, according to an exemplary embodiment.
Figure 2B:
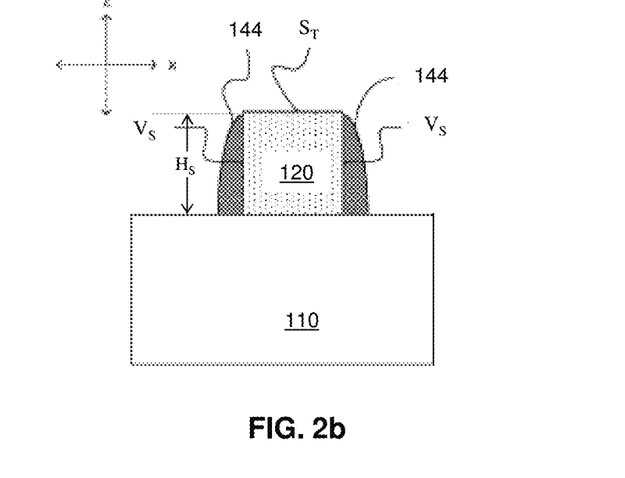
FIG. 2b is a cross-sectional view of FIG. 2a, taken along section line A-A.
Figure 2C:
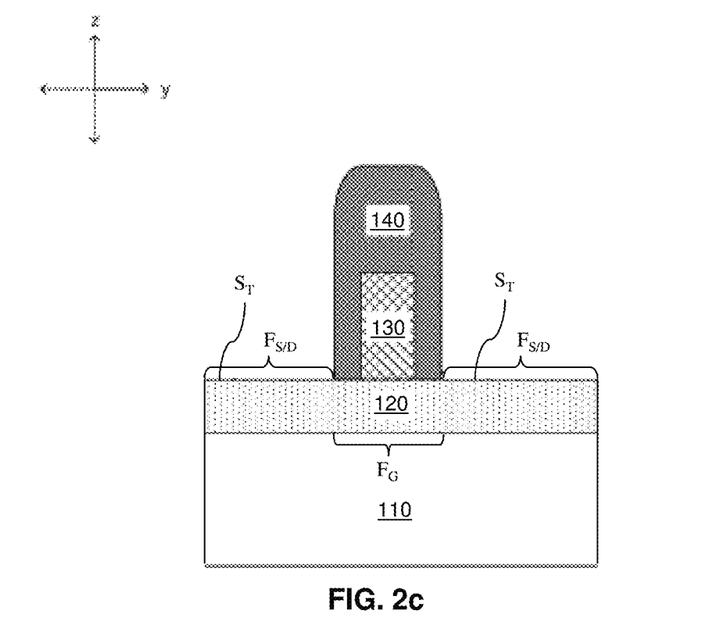
FIG. 2c is a cross-sectional view of FIG. 2a, taken along section line B-B.

Referring to FIGS. 2a-2c, a partial etch of the insulating layer 140 may be performed to expose the top surface $S_T$ of the fin 120, to form a gate insulating layer 142 and a fin spacer pair 144. The partial etch is performed to remove only enough of the insulating layer to expose the top surface $S_T$ of the fin 120, while maintaining the fin spacer pair 144, having a spacer height of $H_S$. The fin spacer pair 144 may have a vertical sidewall $V_S$ located between the fin spacer pair 144 and the fin 120. In exemplary embodiments, the vertical sidewall $V_S$ of the fin spacer pair 144 may directly contact the fin 120. In exemplary embodiments, the fin spacer pair 144 is maintained such that the spacer height $H_S$ is at least 5 nm, and at most equal to the original height of the fin 120. Maintaining a portion of the fin spacer pair 144 at the spacer height $H_S$ while exposing the top surface $S_T$ may provide a surface to etch the fin 120 while maintaining structural components to limit horizontal growth. The partial etch may remove unwanted material from the insulating layer 140 using an anisotropic etching process such as, for example, reactive ion etching (RIE) or plasma etching (not shown), and may be timed based on the amount of material to be removed to achieve the desired spacer height $H_S$. The partial etch may performed to selectively remove portions of the insulating layer 140, without disturbing other structures.

Figure 3A:
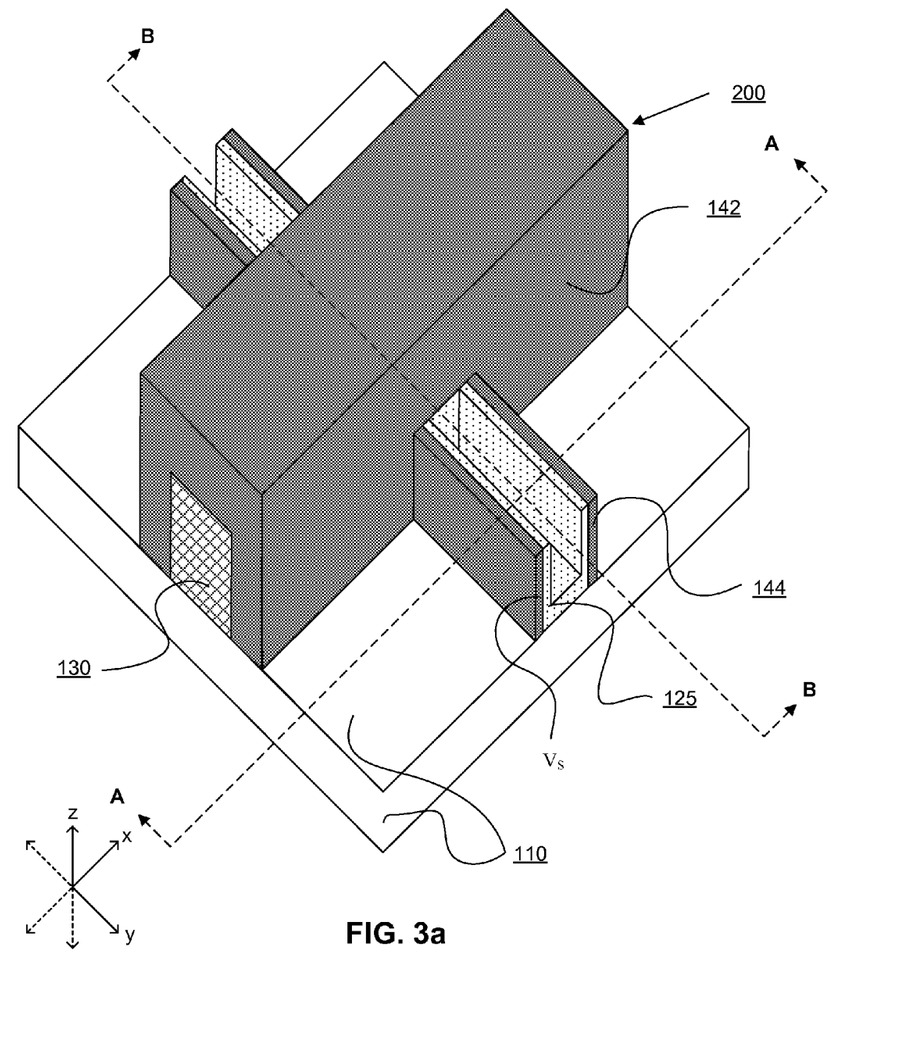
FIG. 3a is an isometric view depicting removing a portion of the fin of a FinFET structure, according to an exemplary embodiment.
Figure 3B:
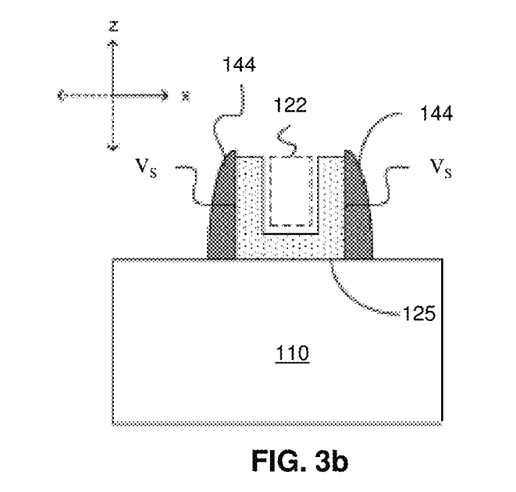
FIG. 3b is a cross-sectional view of FIG. 3a, taken along section line A-A.
Figure 3C:
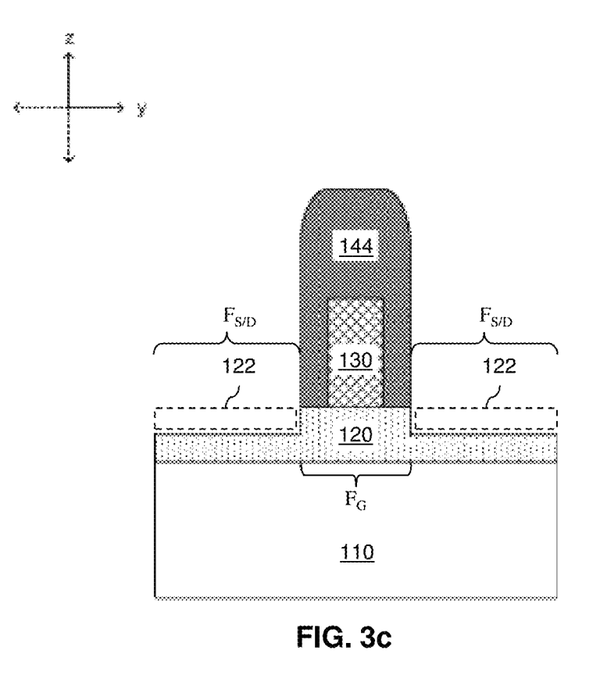
FIG. 3c is a cross-sectional view of FIG. 3a, taken along section line B-B.

Referring to FIGS. 3a-3c, a portion of the fin 120 in the source/drain region $F_{S/D}$ may be etched to create a recessed region 122, located in a recessed fin 125. Following the fin etch, the recessed fin 125 in the source/drain region $F_{S/D}$ may be etched such that the top of the recessed fin 125 is below the top of the fin spacer pair 144. In some embodiments, the recessed fin 125 may contain semiconductor material from the fin 120 in contact with the vertical sidewall $V_S$ and substrate 110. In other embodiments, the fin etch may expose either the vertical sidewall $V_S$, the substrate 110, or both in the source drain region $F_{S/D}$. The fin etch may remove a portion of the fin 120 using an isotropic or an anisotropic etching process such as, for example, reactive ion etching (RIE), wet etching or plasma etching (not shown), and may be timed based on the amount of material to be removed to achieve the desired shape of the recessed region 122 and height $H_{FIN}$ of the recessed fin 125. The fin etch may be selected to selectively remove portions of the insulating layer 140, without disturbing other structures, such as the substrate 110 or the fin spacer pair 144.

Still referring to FIGS. 3a-3c, in additional embodiments the surface of the fin 120 may be refreshed in the source drain region $F_{S/D}$ to improve the surface nucleation sites on the surface $S_T$ of the fin 120. The fin refresh may be performed such that only a few atomic layers at the top of the fin 120 are removed. In some embodiments, the fin refresh may be accomplished by removing at least 0.5 nm of material from the surface $S_T$ of the fin 120, but not more than 4 nm. The amount of the fin 120 that is removed during the fin refresh is dependent upon the possible contamination resulting from previous interaction with the insulating layer 140, as well as any previous process contamination. The fin refresh may remove a portion of the fin 120 using an isotropic or an anisotropic etching process such as, for example, reactive ion etching (RIE), wet etching or plasma etching (not shown).

Figure 4A:
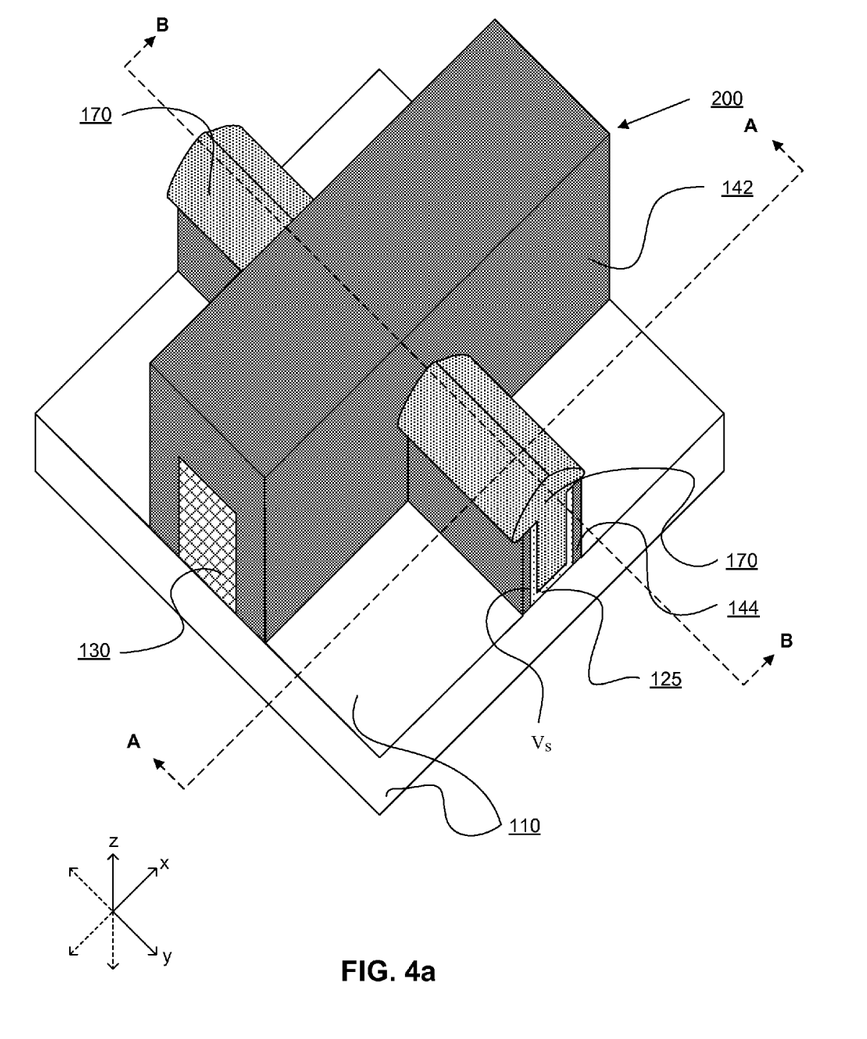
FIG. 4a is an isometric view depicting epitaxial growth of a second semiconductor on the exposed portions of the FinFET structure, according to an exemplary embodiment.
Figure 4B:
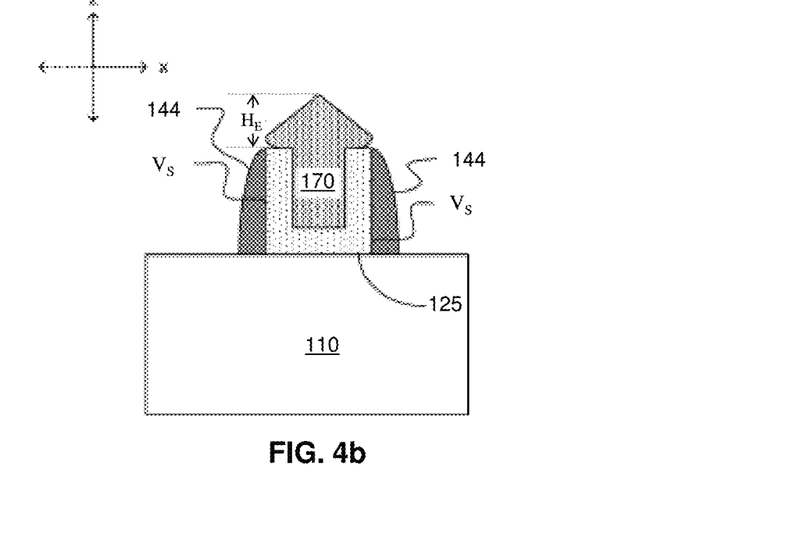
FIG. 4b is a cross-sectional view of FIG. 4a, taken along section line A-A.
Figure 4C:
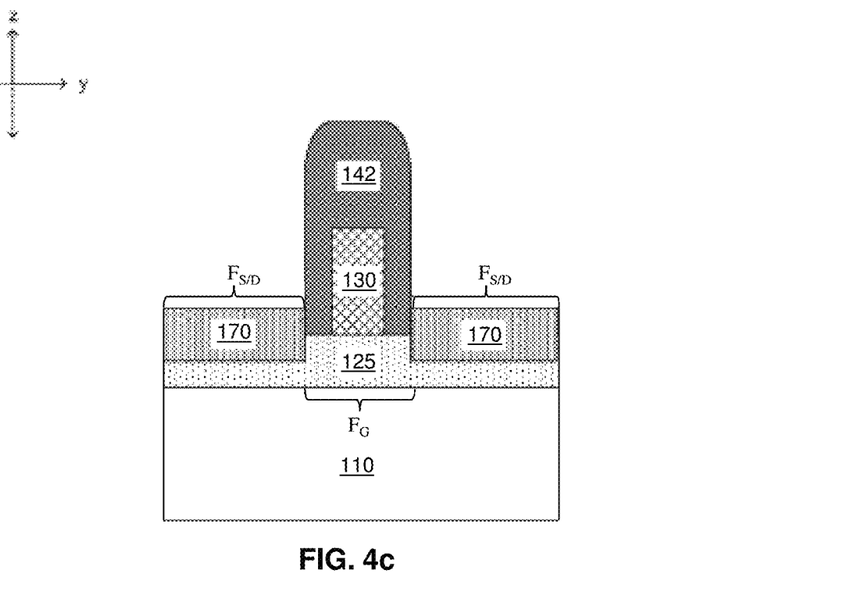
FIG. 4c is a cross-sectional view of FIG. 4a, taken along section line B-B.

Referring to FIGS. 4a-4c, following the fin etch shown in FIGS. 3a-3c, a semiconductor material 170 may be epitaxially grown in the recessed region 122. The semiconductor material 170 may be any semiconductor material, such as the semiconductor materials listed above. In an exemplary embodiment, the semiconductor material 170 may be silicon-germanium. In such embodiments, the silicon germanium material may contain, for example, approximately 20% to approximately 100% germanium, approximately 0% to approximately 80% silicon, and may be doped with p-type dopants, such as boron, in concentrations ranging from approximately $1 \times 10^{20}$ atoms/cm$^3$ to approximately $2 \times 10^{21}$ atoms/cm3. In other exemplary embodiments, the semiconductor material 170 may be carbon doped silicon. In such embodiment, the silicon germanium material may contain, for example, approximately 0.5% to approximately 2.5% carbon, approximately 97.5% to approximately 99.5% silicon, and may be doped with n-type dopants, such as arsenic or phosphorus, in concentrations ranging from approximately $1 \times 10^{20}$ atoms/cm3 to approximately $2 \times 10^{21}$ atoms/cm3. The semiconductor material 170 may be epitaxially grown on the existing crystal lattice of the recessed fin 125 in the source/drain region $F_{S/D}$ and on the exposed surface of the recessed fin 125 in the gate region $F_G$.

The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Still referring to FIGS. 4a-4c, the epitaxial growth may be performed to create various structures, depending on device parameters. For example, increasing the height of the epitaxial top $H_E$ may reduce unwanted capacitance of the device. In some embodiments, epitaxial growth may progress to the point where the distance between the semiconductor material 170 of two consecutive fin structures is 0.

Following the epitaxial growth in FIGS. 4a-4c, a semiconductor structure may be formed on a substrate, where the structure has an embedded fin made of at least 2 semiconductor materials and a gate structure intersecting the embedded fin. The embedded fin may have a fin spacer pair 144 along the vertical sides of the embedded fin. The fin spacer pair 144 allows the material of the fin 120 to be etched away, and replaced with a different semiconductor material 170, while preventing epitaxial growth on the sides of the fin when the different semiconductor material is deposited in place of the etched away fin in order to create the embedded fin. Replacing the original semiconductor material of the fin 120 with a different semiconductor material 170, to create the embedded fin, allows there to be a sharp junction profile between the source/drain region of the FET and the channel region of the FET, which may reduce the overall resistance of the structure, and lead to overall better performance of the device. This may create an embedded source/drain region similar to those found in planar FETs, but with the dimensions and characteristics of FinFETs.

Figure 5A:
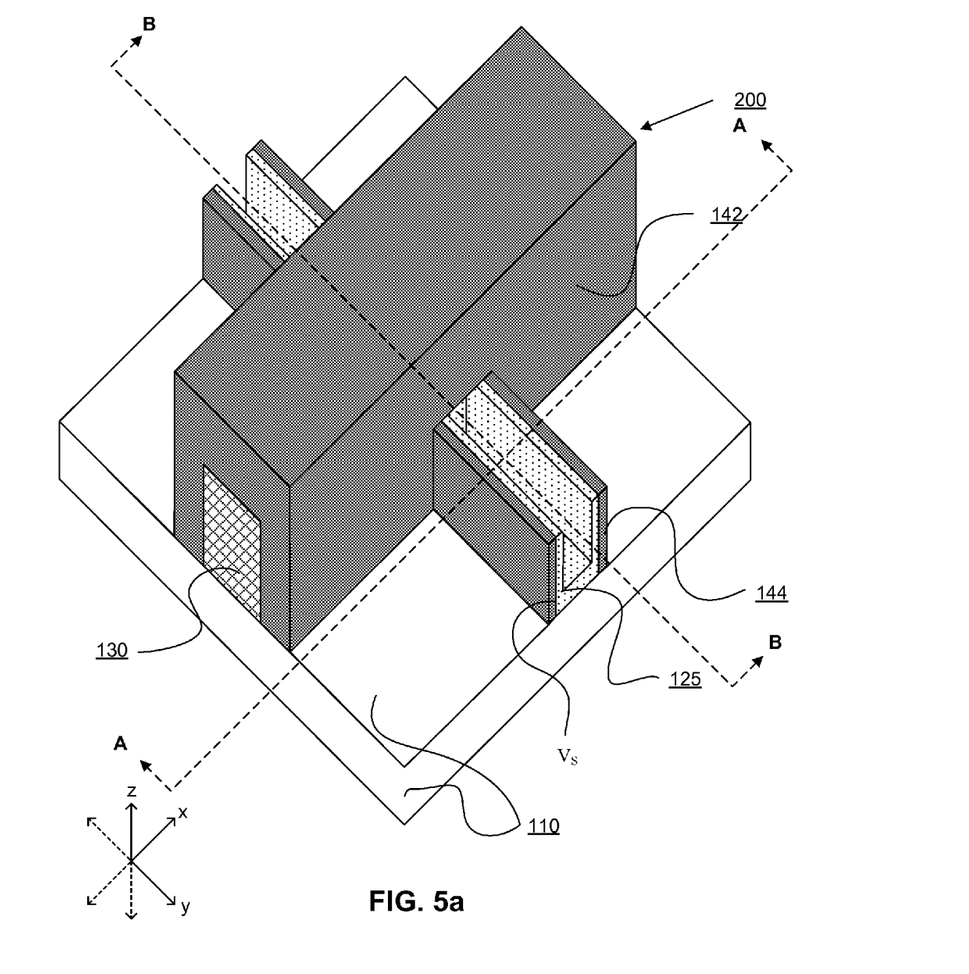
FIG. 5a is an isometric view depicting an optional gate undercut etch, according to an exemplary embodiment.
Figure 5B:
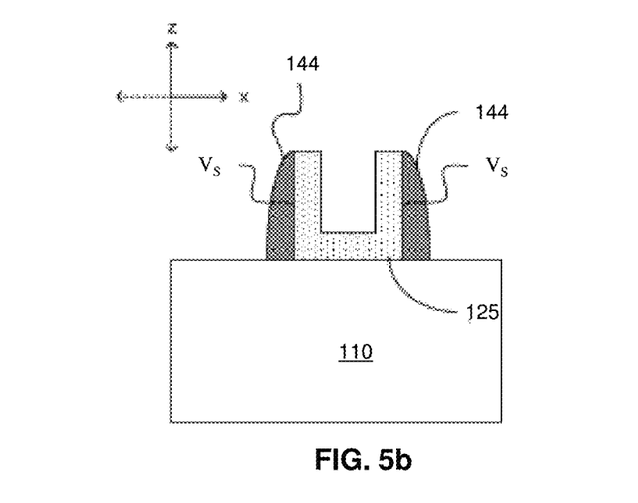
FIG. 5b is a cross-sectional view of FIG. 5a, taken along section line A-A.
Figure 5C:
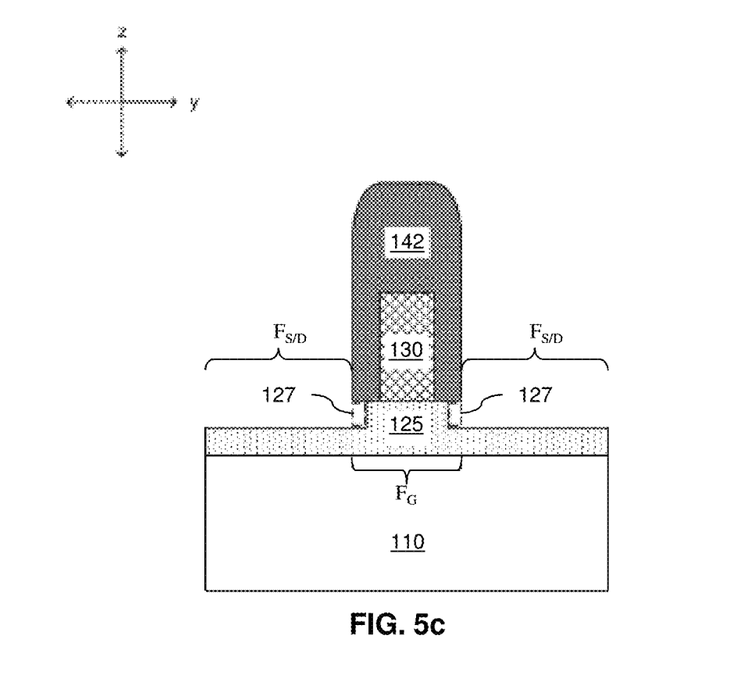
FIG. 5c is a cross-sectional view of FIG. 5a, taken along section line B-B.

Referring to FIGS. 5a-5c, following the recess of the fin 120 shown in FIGS. 3a-3c, additional embodiments may perform an undercut etch to remove fin material below gate insulating layer 142, and create undercut region 127. This may be done to reduce the overall resistance of the gate structure, or introduce strain underneath the gate, by subsequently replacing the semiconductor material of the fin 120 with a different material. The undercut etch may be any type of etching process that would remove portions of the fin 120 below the gate insulating layer 142 such as, for example, a timed isotropic etch or an angled anisotropic etch. The undercut etch may be performed by a wet etch or angled etch process capable of selectively removing material from the fin 120 without substantially removing material from the surrounding fin spacer pair 144 or the gate insulating layer 142. In embodiments using an angled etch (not shown), prior to etching the recessed fin 125 in the gate region $F_G$ the semiconductor material may have a <110> crystal lattice structure, which will etch faster than planes having a <111> crystal lattice structure. As the etch progresses, the <110> plane of the recessed fin 125 may be etched away to expose <111> planes angled inward away from the recessed fin 125. These <111> planes may form the boundary of the undercut region 127. If the etch proceeds to the point where the <111> planes intersect, then the undercut region 127 may be v-shaped. Otherwise, the undercut region 127 may be sigma-shaped.

Figure 6A:
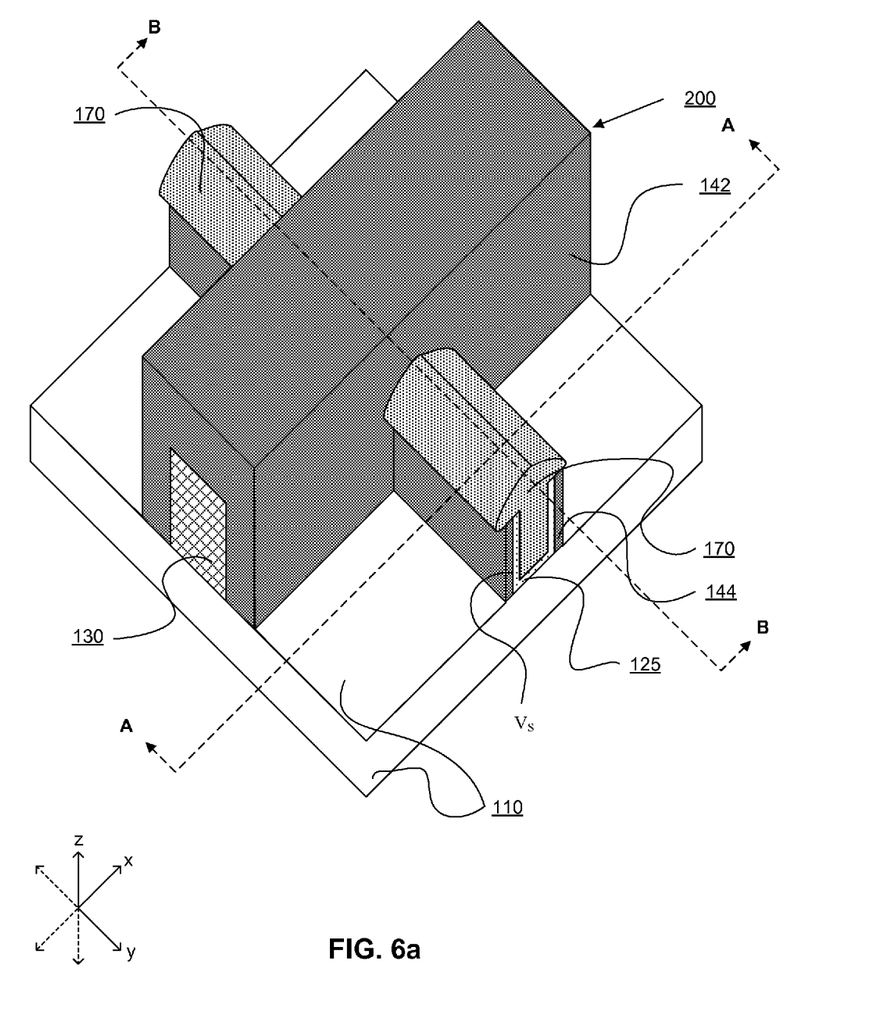
FIG. 6a is an isometric view depicting epitaxial growth of a second semiconductor on the exposed portions of the FinFET structure, according to an exemplary embodiment.
Figure 6B:
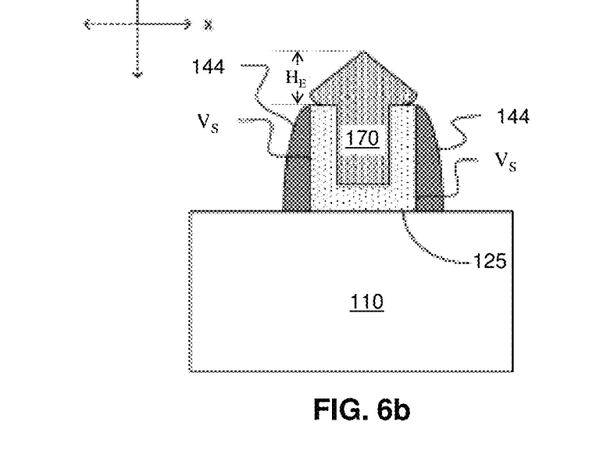
FIG. 6b is a cross-sectional view of FIG. 6a, taken along section line A-A.
Figure 6C:
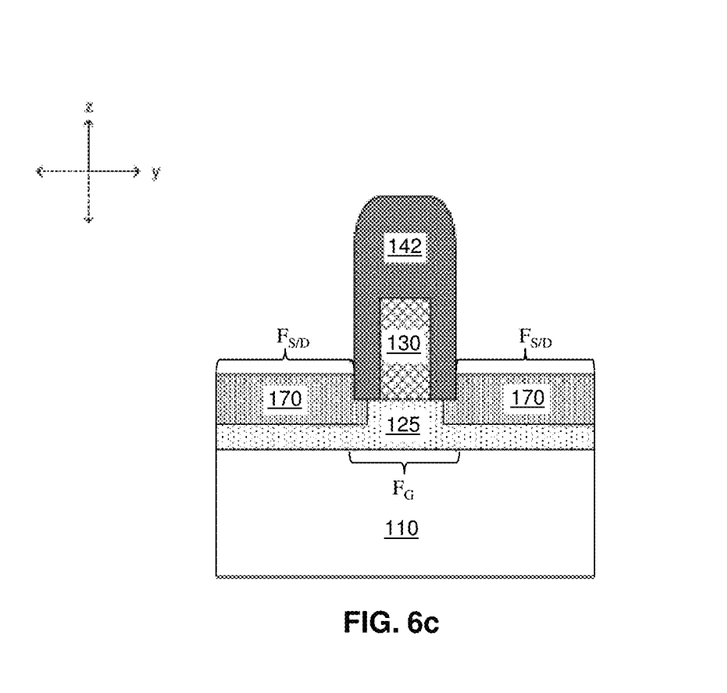
FIG. 6c is a cross-sectional view of FIG. 6a, taken along section line B-B.

Referring to FIGS. 6a-6c, following the undercut etch shown in FIG. 5, a semiconductor material 170 may be epitaxially grown in the recessed region 122. In some embodiments the semiconductor material 170 may be a material that introduces strain into the channel below the gate layer 130, such as, for example, any material that has a larger or smaller lattice constant than that of crystalline silicon. In an exemplary embodiment, the semiconductor material 170 may be silicon-germanium. In such embodiments, the semiconductor material may contain, for example, approximately 20% to approximately 100% germanium, approximately 0% to approximately 80% silicon, and may be doped with p-type dopants, such as boron, in concentrations ranging from approximately $1 \times 10^{20}$ atoms/cm3 to approximately $2 \times 10^{21}$ atoms/cm3. In other exemplary embodiments, the semiconductor material 170 may be carbon doped silicon. In such embodiment, the semiconductor material 170 may contain, for example, approximately 0.5% to approximately 2.5% carbon, approximately 97.5% to approximately 99.5% silicon, and may be doped with n-type dopants, such as arsenic or phosphorus, in concentrations ranging from approximately $1 \times 10^{20}$ atoms/cm3 to approximately $2 \times 10^{21}$ atoms/cm3. The semiconductor material 170 may be epitaxially grown on the existing crystal lattice of the recessed fin 125 in the source/drain region $F_{S/D}$ and on the exposed surface of the recessed fin 125 in the gate region $F_G$.

The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Still referring to FIGS. 6a-6c, the epitaxial growth may be performed to create various structures, depending on device parameters. For example, increasing the height of the epitaxial top H$_E$ may reduce unwanted capacitance of the device. In some embodiments, epitaxial growth may progress to the point where the distance between the semiconductor material 170 of two consecutive fin structures is 0.

Following the epitaxial growth in FIGS. 6a-6c, a semiconductor structure may be formed on a substrate, where the structure has an embedded fin made of at least 2 semiconductor materials and a gate structure intersecting the embedded fin. The embedded fin may have a fin spacer pair 144 along the vertical sides of the embedded fin. The fin spacer pair 144 allows the material of the fin 120 to be etched away, and replaced with a different semiconductor material 170, while preventing epitaxial growth on the sides of the fin when the different semiconductor material is deposited in place of the etched away fin in order to create the embedded fin. Replacing the original semiconductor material of the fin 120 with a different semiconductor material 170, to create the embedded fin, allows there to be a sharp junction profile (i.e. there is a sharp chemical gradient between the original semiconductor material of the fin 120 and the epitaxially grown semiconductor material 170) between the source/drain region of the FET and the channel region of the FET, which may reduce the overall resistance of the structure, and lead to overall better performance of the device. This may create an embedded source/drain region similar to those found in planar FETs, but with the dimensions and characteristics of FinFETs.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of forming a semiconductor structure, the method comprising:
   forming a semiconductor fin on a substrate, wherein the semiconductor fin has a source/drain region and a gate region;
   forming a gate above the gate region of the semiconductor fin;
   forming an insulating layer on the substrate, the semiconductor fin and the gate;
   performing a first etch, wherein the first etch comprises removing the insulating layer from a top surface of the semiconductor fin in the source/drain region while maintaining a portion of the insulating layer on at least one vertical surface of the semiconductor fin in the source/drain region;
   performing a second etch, wherein the second etch comprises forming a recessed fin, the recessed fin comprising a trench formed in at least a portion of the semiconductor fin in the source/drain region, the source/drain region of the recessed fin having a U-shape along a length dimension of said recessed fin, with a horizontal section on the substrate and vertical sections extending upward from the horizontal section;
   epitaxially growing a semiconductor material in the trench formed in the source/drain region of the semiconductor fin, the vertical sections of the recessed fin being positioned laterally between the insulating layer and the semiconductor material epitaxially grown within the trench; and
   prior to epitaxially growing the semiconductor material, performing a third etch, wherein the third etch comprises removing a portion of the semiconductor fin in the gate region, said third etch comprising an anisotropic etch along the <111> plane of the substrate.

2. The method of claim 1, wherein the second etch comprises an anisotropic etch.

3. The method of claim 1, wherein the second etch exposes the substrate located below the semiconductor fin.

4. The method of claim 1, wherein the second etch removes the entirety of the semiconductor fin in the source/drain region.

5. The method of claim 1, wherein the substrate is a semiconductor on insulator structure.

6. The method of claim 5, wherein forming the semiconductor fin on the substrate comprises removing material from the substrate to create the semiconductor fin, and exposing an insulator layer between the semiconductor fin and the substrate.

7. The method of claim 1, wherein the semiconductor material used for epitaxial growth is selected from the group consisting of silicon-germanium, silicon-germanium-boron, silicon-carbon, silicon-carbon-phosphorus, and silicon-carbon-arsenic.

8. A method of forming a semiconductor structure, the method comprising:
   forming a semiconductor fin on a substrate, wherein the semiconductor fin has a source/drain region and a gate region;
   forming a gate above the gate region of the semiconductor fin;
   forming an insulating layer on the substrate, the semiconductor fin and the gate;
   removing the insulating layer from a top surface of the semiconductor fin in the source/drain region while maintaining a portion of the insulating layer on at least one vertical surface of the semiconductor fin in the source/drain region;
   forming a trench within the semiconductor fin, the trench being U-shaped along a length dimension of said semiconductor fin, with a horizontal section on the substrate and vertical sections extending upward from the horizontal section;
   performing a surface refresh on the top surface of the semiconductor fin in the source/drain region, said surface refresh comprising removing at least 3 atomic layers and no more than 4 nanometers from the top surface of the semiconductor fin, wherein the surface refresh comprises creating sites for epitaxial nucleation; and
   epitaxially growing a semiconductor material in the trench and on the top surface of the semiconductor fin after it has been refreshed.

9. The method of claim 8, wherein the substrate is a semiconductor on insulator structure.

10. The method of claim 9, wherein forming the semiconductor fin on the substrate comprises removing material from the substrate to create the semiconductor fin, and exposing an insulator layer between the semiconductor fin and the substrate.

11. The method of claim 8, wherein the semiconductor material used for epitaxial growth is selected from the group consisting of silicon-germanium, silicon-germanium-boron, silicon-carbon, silicon-carbon-phosphorus, and silicon-carbon-arsenic.

* * * * *